(12) United States Patent
Han et al.

(10) Patent No.: US 9,312,433 B2
(45) Date of Patent: Apr. 12, 2016

(54) LIGHT EMITTING ELEMENT

(71) Applicant: LG INNOTEK CO., LTD., Seoul (KR)

(72) Inventors: Dae Seob Han, Seoul (KR); Yong Tae Moon, Seoul (KR); A Ra Cho, Seoul (KR); Kwang Sun Baek, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/430,626

(22) PCT Filed: Sep. 24, 2013

(86) PCT No.: PCT/KR2013/008553
§ 371 (c)(1),
(2) Date: Mar. 24, 2015

(87) PCT Pub. No.: WO2014/046527
PCT Pub. Date: Mar. 27, 2014

(65) Prior Publication Data
US 2015/0255669 A1    Sep. 10, 2015

(30) Foreign Application Priority Data

Sep. 24, 2012  (KR) .................. 10-2012-0106039

(51) Int. Cl.
*H01L 29/06*       (2006.01)
*H01L 33/06*       (2010.01)
(Continued)

(52) U.S. Cl.
CPC ................ *H01L 33/06* (2013.01); *H01L 33/04* (2013.01); *H01L 33/32* (2013.01); *H01L 33/0025* (2013.01); *H01L 33/22* (2013.01); *H01L 2924/0002* (2013.01)

(58) Field of Classification Search
CPC .......... H01L 33/04; H01L 33/32; H01L 33/06
USPC ....................................................... 257/13
See application file for complete search history.

(56) References Cited

U.S. PATENT DOCUMENTS

| 6,388,275 B1* | 5/2002 | Kano | ................... B82Y 20/00 257/11 |
| 2011/0240957 A1* | 10/2011 | Okuno | ................... H01L 33/04 257/13 |

(Continued)

FOREIGN PATENT DOCUMENTS

| EP | 1 401 027 A1 | 3/2004 |
| JP | 2011-100772 A | 5/2011 |

(Continued)

OTHER PUBLICATIONS

International Search Report dated Jan. 28, 2014 issued in Application No. PCT/KR2013/008553 (with English translation).

*Primary Examiner* — Douglas Menz
(74) *Attorney, Agent, or Firm* — KED & Associates, LLP

(57) ABSTRACT

Embodiments of the present invention include a light emitting element, a method for manufacturing the light-emitting element according to one embodiment of the present invention, comprises: a first conductive semiconductor layer 112; a GaN-based superlattice layer 124 on the first conductive semiconductor layer 112; an active layer 114 on the GaN-based superlattice layer 124; and a second conductive semiconductor layer 116 on the active layer 114, wherein the GaN-based superlattice layer 124 has a bandgap energy level that varies in a direction from the first conductive semiconductor layer 112 to the active layer 114.

19 Claims, 6 Drawing Sheets

(51) Int. Cl.
*H01L 33/04* (2010.01)
*H01L 33/32* (2010.01)
*H01L 33/22* (2010.01)
*H01L 33/00* (2010.01)

(56) References Cited

U.S. PATENT DOCUMENTS

2012/0043526 A1 2/2012 Moon et al.
2012/0056156 A1\* 3/2012 Kikuchi ............... H01L 33/04
 257/13
2012/0104356 A1\* 5/2012 Han ...................... H01L 33/06
 257/13

FOREIGN PATENT DOCUMENTS

KR 10-2008-0010136 A 1/2008
KR 10-2011-0133239 A 12/2011
KR 10-2012-0053190 A 5/2012

\* cited by examiner

LIGHT EMITTING ELEMENT

CROSS-REFERENCE TO RELATED PATENT APPLICATIONS

This application is a U.S. National Stage Application under 35 U.S.C. §371 of PCT Application No. PCT/KR2013/008553, filed Sep. 24, 2013, which claims priority to Korean Patent Application No. 10-2012-0106039, filed Sep. 24, 2012, whose entire disclosures are hereby incorporated by reference.

TECHNICAL FIELD

The embodiment relates to a light emitting device, a method of manufacturing the same, a light emitting device package, and a lighting system.

BACKGROUND ART

A light emitting device (LED) includes a p-n junction diode having a characteristic of converting electric energy into light energy. The p-n junction diode can be formed by combining group III-V elements of the periodic table. The light emitting device can represent various colors by adjusting the compositional ratio of compound semiconductors.

When forward voltage is applied to the LED, electrons of an n layer are bonded with holes of a p layer, so that energy corresponding to an energy gap between a conduction band and a valance band may be generated. This energy is mainly realized as heat or light, and the LED emits the energy as the light.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

Recently, as the demand for the high-efficiency LED has been increased, the improvement of the intensity of light has been issued.

In order to improve the intensity of light, various attempts, such as improvement of a multi-quantum well (MQW) of an active layer, improvement of an electron blocking layer and improvement of a lower layer of the active layer, have been performed, but the great effect is not achieved.

DISCLOSURE

Technical Problem

The embodiment provides a light emitting device capable of improving the intensity of light, a method of manufacturing the same, a light emitting device package, and a lighting system.

Technical Solution

According to the embodiment, there is provided a light emitting device including a first conductive semiconductor layer 112; a GaN-based superlattice layer 124 on the first conductive semiconductor layer 112; an active layer 114 on the GaN-based superlattice layer 124; and a second conductive semiconductor layer 116 on the active layer 114, wherein the GaN-based superlattice layer 124 has a bandgap energy level that varies in a direction from the first conductive semiconductor layer 112 to the active layer 114.

Advantageous Effects

The embodiment can provide a light emitting device having an optimum structure capable of improving the intensity of light at an epitaxial end, a method of manufacturing the same, a light emitting device package, and a lighting system.

BEST MODE

Mode for Invention

Hereinafter, a light emitting device, a light emitting device package, and a lighting system according to embodiments will be described in detail with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiment)

Figure 1:
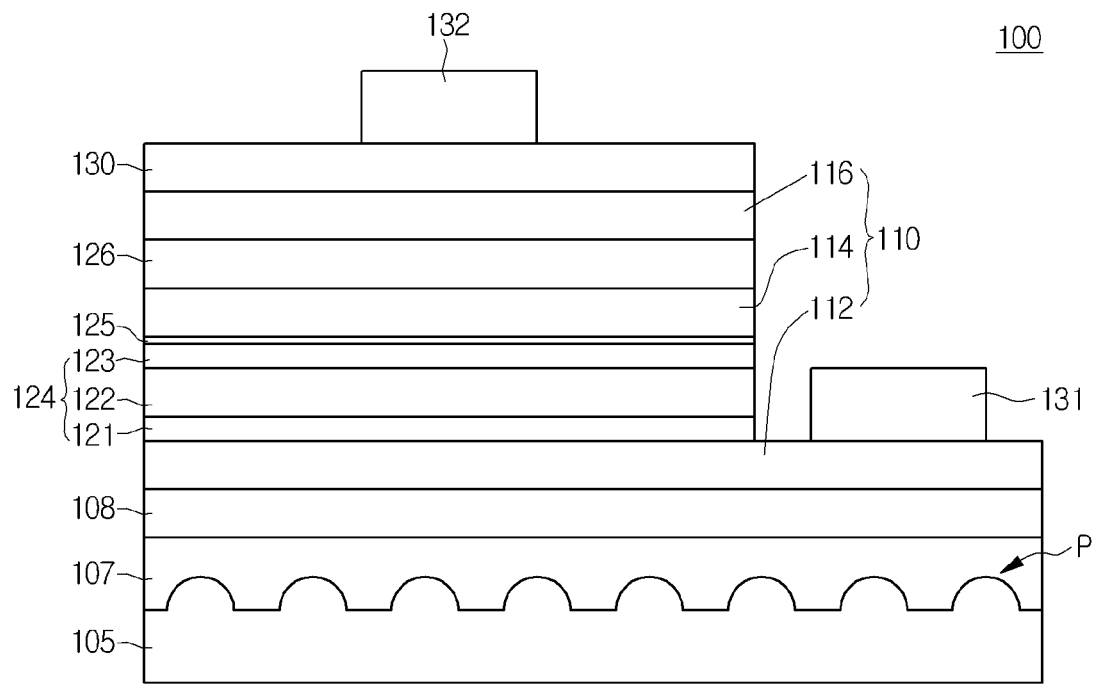
FIG. 1 is a sectional view showing a light emitting device according to the embodiment.
Figure 2:
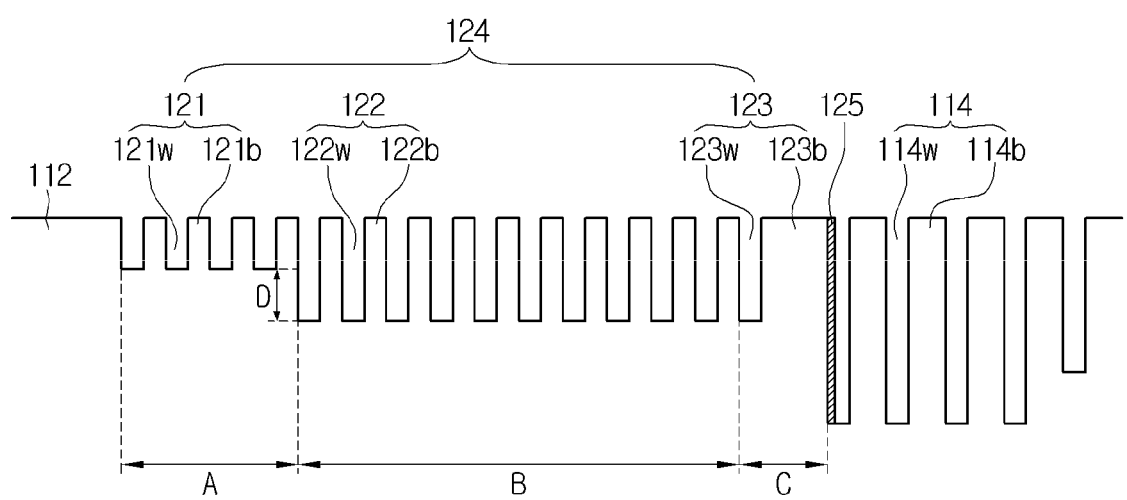
FIG. 2 is a view partially illustrating an energy band diagram of a light emitting device according to the embodiment.

FIG. 1 is a sectional view showing a light emitting device according to the embodiment and FIG. 2 is a view partially illustrating an energy band diagram of a light emitting device according to the embodiment.

A light emitting device 100 according to the embodiment includes a first conductive semiconductor layer 112, a GaN-based superlattice layer 124 on the first conductive semiconductor layer 112, an active layer 114 on the GaN-based superlattice layer 124, and a second conductive semiconductor layer 116 on the active layer 114.

According to the embodiment, the light emitting device having an optimum structure capable of improving the intensity of light at an epitaxial end can be provided.

To this end, according to the embodiment as shown in FIG. 2, the GaN-based superlattice layer 124 may have a bandgap energy level that varies in the direction from the first conductive semiconductor layer 112 to the active layer 114. For instance, the GaN-based superlattice layer 124 may have the bandgap energy level reduced step by step in the direction from the first conductive semiconductor layer 112 to the active layer 114, but the embodiment is not limited thereto.

In detail, the GaN-based superlattice layer 124 may include a first group GaN-based superlattice layer 121 formed in an A region adjacent to the first conductive semiconductor layer 112 and having a first bandgap energy and a second group GaN-based superlattice layer 122 formed on the first group GaN-based superlattice layer 121 (B region) and having a second bandgap energy lower than the first bandgap energy.

In addition, the GaN-based superlattice layer 124 may further include a third group GaN-based superlattice layer 123 formed on the second group GaN-based superlattice layer 122 (C region) adjacent to the active layer 114 and having a third bandgap energy.

The third bandgap energy may be equal to or lower than the second bandgap energy, but the embodiment is not limited thereto.

The first group GaN-based superlattice layer 121 may include a first group well 121w and a first group barrier 121b, the second group GaN-based superlattice layer 122 may include a second group well 122w and a second group barrier 122b, and the third group GaN-based superlattice layer 123 may include a third group well 123w and a third group barrier 123b.

The GaN-based superlattice layer 124 may include an $In_xGa_{1-x}N/GaN$ superlattice layer (0<x<1). A difference D between the first bandgap energy level and the second bandgap energy level may be equal to or higher than a phonon energy level of the GaN-based superlattice layer 124.

For instance, a part of energy of the hot electron can be transferred in the form of photon energy only when a difference of a well depth (energy difference) in each group of the GaN-based superlattice layer is equal to or higher than phonon energy (about 88 meV) of InGaN.

The GaN-based superlattice layer 124 according to the embodiment may have at least two energy steps and the depth of a quantum well (multi-quantum well) of the active layer 114 is about 200 Mev, so a plurality of energy steps can be provided and a number of the energy steps may be determined by dividing the depth of the quantum well by the minimum photon energy.

According to the embodiment, the energy level of each group can be adjusted by controlling concentration of indium.

For instance, the concentration of indium in the second group GaN-based superlattice layer 122 is set higher than the concentration of indium in the first group GaN-based superlattice layer 122, so the energy level of the second group well 122w may be lower than the energy level of the first group well 121w.

According to the embodiment, hot electrons may be cooled by the GaN-based superlattice layer having a plurality of energy steps, so that a high-power light emitting device having an effective electron injection layer can be provided.

According to the embodiment, the thickness of the GaN-based superlattice layer of each group may be controlled in order to improve the electron injection efficiency by effectively cooling the hot electron.

For instance, the thickness of the first group GaN-based superlattice layer 121 may be thinner than the thickness of the second group GaN-based superlattice layer 122.

At this time, the thickness of the first group well 121w of the first group GaN-based superlattice layer 121 may be equal to the thickness of the first group barrier 121b of the first group GaN-based superlattice layer 121 and the first group well 121w and the first group barrier 121b may be prepared with a plurality of periodicities. For instance, the first group well 121w and the first group barrier 121b may be controlled to have the same thickness in the range of about 1 nm to 3 nm and may be prepared with a plurality of periodicities so that the hot carrier can be effectively cooled as compared with a case where a single thick well and a single thick barrier are presented.

In addition, the second group well 122w and the second group barrier 122b of the second group GaN-based superlattice layer 122 may be controlled to have the same thickness in the range of about 1 nm to 3 nm and may be prepared with a plurality of periodicities so that the hot carrier can be effectively cooled as compared with a case where a single thick well and a single thick barrier are presented.

At this time, the thickness of the second group well 122w may be equal to the thickness of the first group well 121w and the thickness of the second group barrier 122b may be equal to the thickness of the first group barrier 121b. Thus, even if the carrier recognizes a predetermined energy barrier in the GaN-based superlattice layer, the carrier may not be extinguished within the GaN-based superlattice layer due to the well and the barrier having the regular thickness, so that the carrier can be effectively injected.

According to the embodiment, the total thickness of the second group GaN-based superlattice layer 122 may be thicker than the total thickness of the first group GaN-based superlattice layer 121. For instance, the second group GaN-based superlattice layer 122 may include the second group well 122w and the second group barrier 122b repeatedly formed with about 8 to 12 periodicities and the first group GaN-based superlattice layer 121 may include the first group well 121w and the first group barrier 121b repeatedly formed with about 3 to 5 periodicities.

According to the embodiment, the hot carriers may be stably cooled for long time in the second group GaN-based superlattice layer 122 that meets partially-cooled hot carriers rather than the first group GaN-based superlattice layer 121 that primarily meets the hot carriers, so the hot carriers may be effectively cooled without being overflown.

In addition, according to the embodiment, the thickness of the third group well 123w of the third group GaN-based superlattice layer 123 may be equal to the thickness of the second group well 122w and thinner than the thickness of the third group barrier 123b.

For instance, the thickness of the third group well 123w may be in the range of about 1 nm to about 3 nm, and the thickness of the third group barrier 123b may be in the range of about 7 nm to about 11 nm, but the embodiment is not limited thereto.

According to the embodiment, the third group barrier 123b may be adjacent to the active layer, and the thickness of the third group barrier 123b, which is the final barrier, may be thicker than that of the barriers and wells of other groups.

According to the embodiment, the third group barrier 123b is doped with a first conductive element to improve the electron injection efficiency.

In addition, according to the embodiment, an undoped GaN layer 125 may be further provided between the third group barrier 123b and the quantum well 114w of the active layer 114 to prevent the first conductive element doped in the third group barrier 123b from diffusing into the active layer that restricts the radiative recombination.

The undoped GaN layer 125 is thinner than the third group barrier 123b to minimize the lattice mismatch while preventing the first conductive element doped in the third group barrier 123b from diffusing into the active layer.

According to the embodiment, the hot electrons are cooled by the GaN-based superlattice layer having a plurality of energy steps, so that the high-power light emitting device having the effective electron injection layer can be provided.

Reference numerals, which are shown in FIG. 1 and not described above, will be explained below in the method of manufacturing the light emitting device according to the embodiment.

Hereinafter, the method of manufacturing the light emitting device according to the embodiment will be described with reference to FIGS. 3 to 5.

Figure 3:
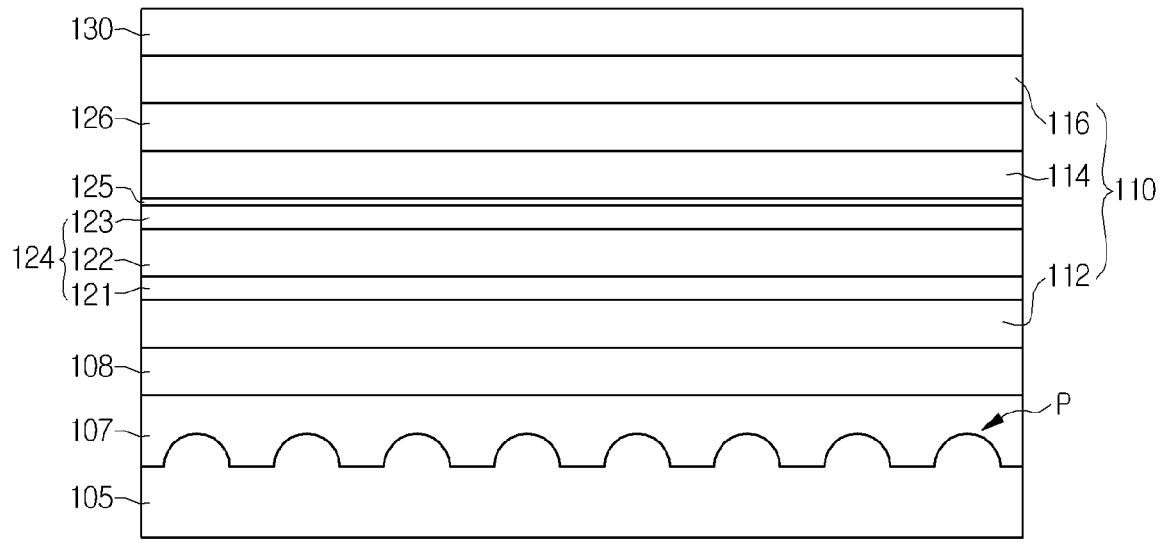
FIGS. 3 to 5 are sectional views showing a method of manufacturing a light emitting device according to the embodiment.
Figure 4:
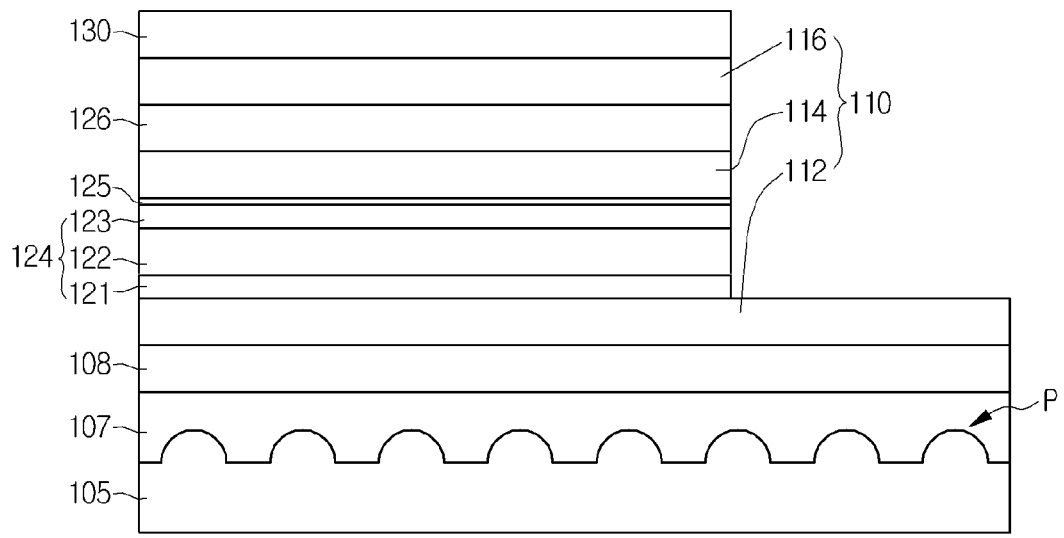
Figure 5:
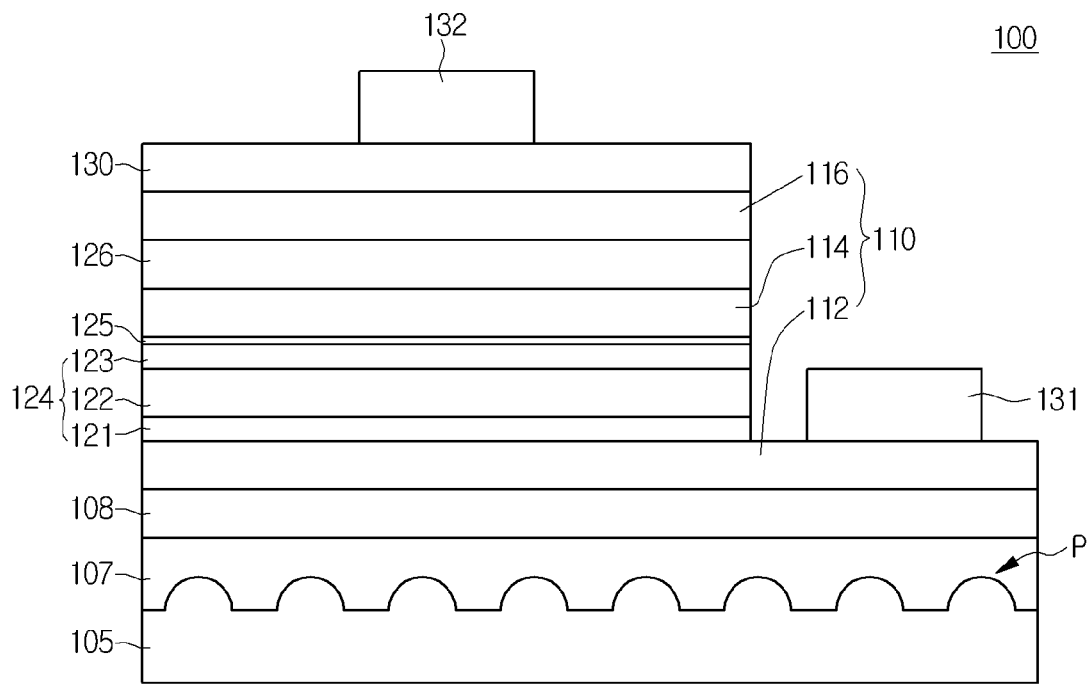

Although FIGS. 3 to 5 show a lateral type light emitting device, in which a light emitting device 100 is grown on a predetermined growth substrate 105, the embodiment is not limited thereto. The embodiment may be applicable to a vertical type light emitting device in which an electrode is formed on a first conductive semiconductor layer exposed after a growth substrate has been removed. Hereinafter, the embodiment will be described with reference to FIGS. 3 to 5 and the embodiment is not limited to the lateral type light emitting device.

First, as shown in FIG. 3, the substrate 105 of the light emitting device may be formed of a material having superior thermal conductivity and may include a conductive substrate or an insulating substrate. For instance, the substrate 105 may include at least one of $Al_2O_3$, SiC, Si, GaAs, GaN, ZnO, GaP, InP, Ge, and $Ga_2O_3$.

According to the embodiment, a light reflective pattern P is provided to improve the light extraction efficiency. For instance, a PSS (Patterned Sapphire Substrate) may be formed on the substrate 105 to improve the light extraction efficiency.

In addition, according to the embodiment, a buffer layer 107 and an undoped semiconductor layer 108 are formed on the substrate 105 to attenuate the lattice mismatch between a material of the light emitting structure 110 and the substrate 105. For instance, the buffer layer 107 may be formed of group III-V compound semiconductors. In detail, the buffer layer 107 may include at least one of GaN, InN, AlN, InGaN, AlGaN, InAlGaN, and AlInN, but the embodiment is not limited thereto.

Then, a first conductive semiconductor layer 112 may be formed on the undoped semiconductor layer 108. For instance, the first conductive semiconductor layer 112 may include a semiconductor material having a compositional formula of $InxAly Ga_{1-x-y}N$ (0≤x≤1, 0≤y≤1, 0≤x+y≤1). In detail, the first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP, but the embodiment is not limited thereto.

After that, the GaN-based superlattice layer 124 may be formed on the first conductive semiconductor layer 112. The GaN-based superlattice layer 124 may attenuate the stress caused by the lattice mismatch between first conductive semiconductor layer 112 and the active layer 114.

According to the embodiment, the light emitting device having an optimum structure capable of improving the intensity of light at an epitaxial end can be provided.

To this end, as shown in FIG. 2, the GaN-based superlattice layer 124 may have the bandgap energy that varies in the direction from the first conductive semiconductor layer 112 to the active layer 114.

For instance, according to the embodiment, the GaN-based superlattice layer 124 may include a first group GaN-based superlattice layer 121 having a first bandgap energy and a second group GaN-based superlattice layer 122 having a second bandgap energy lower than the first bandgap energy.

In addition, the GaN-based superlattice layer 124 may further include a third group GaN-based superlattice layer 123 formed on the second group GaN-based superlattice layer 122 and having the second bandgap energy.

The first group GaN-based superlattice layer 121 may include a first group well 121w and a first group barrier 121b, the second group GaN-based superlattice layer 122 may include a second group well 122w and a second group barrier 122b, and the third group GaN-based superlattice layer 123 may include a third group well 123w and a third group barrier 123b.

The GaN-based superlattice layer 124 may include an $In_xGa_{1-x}N$/GaN superlattice layer (0<x<1). A difference D between the first bandgap energy level and the second bandgap energy level may be equal to or higher than a phonon energy level of the GaN-based superlattice layer 124.

For instance, a part of an energy of the hot electron can be transferred in the form of a photon energy only when a difference of a well depth (energy difference) in each group of the GaN-based superlattice layer is equal to or higher than a phonon energy (about 88 meV) of InGaN.

The GaN-based superlattice layer 124 according to the embodiment may have at least two energy steps and the depth of a quantum well (multi-quantum well) of the active layer 114 is about 200 Mev, so a plurality of energy steps can be provided and a number of the energy steps may be determined by dividing the depth of the quantum well by the minimum photon energy.

According to the embodiment, the growth temperature of the first group well 121w of the first group GaN-based superlattice layer 121 may be higher than the growth temperature of the second group well 122w of the second group GaN-based superlattice layer 122. For instance, the first group well 121w may be grown at the temperature of about 500° C. or below and the second group well 122w may be grown at the temperature of about 900° C. or above.

The GaN-based superlattice layer 124 may be grown at the temperature of about 800° C. or above.

The amount of indium (In) in the well of each group of the GaN-based superlattice layer 124 may be controlled through PL (photo luminescence) sub-peak position, but the embodiment is not limited thereto.

According to the embodiment, the energy level of each group can be controlled by controlling concentration of indium in the well of each group. For instance, a concentration of indium in the second group GaN-based superlattice layer 122 is set higher than a concentration of indium in the first group GaN-based superlattice layer 121. In this case, the energy level of the second group well 122w may be lower than the energy level of the first group well 121w.

According to the embodiment, hot electrons are cooled by the GaN-based superlattice layer having a plurality of energy steps, so that a high-power light emitting device having an effective electron injection layer can be provided.

According to the embodiment, the thickness of the GaN-based superlattice layer of each group may be controlled in order to improve the electron injection efficiency by effectively cooling the hot electron.

For instance, the thickness of the first group GaN-based superlattice layer 121 may be thinner than the thickness of the second group GaN-based superlattice layer 122.

At this time, the thickness of the first group well 121w of the first group GaN-based superlattice layer 121 may be equal to the thickness of the first group barrier 121b of the first group GaN-based superlattice layer 121 and the first group well 121w and the first group barrier 121b may be prepared with a plurality of periodicities. For instance, the first group well 121w and the first group barrier 121b may be controlled to have the same thickness in the range of about 1 nm to 3 nm and may be prepared with a plurality of periodicities so that the hot carrier can be effectively cooled as compared with a case where a single thick well and a single thick barrier are presented.

In addition, the second group well 122w and the second group barrier 122b of the second group GaN-based superlattice layer 122 may be controlled to have the same thickness in the range of about 1 nm to 3 nm and may be prepared with a plurality of periodicities so that the hot carrier can be effectively cooled as compared with a case where a single thick well and a single thick barrier are presented.

At this time, the thickness of the second group well 122w may be equal to the thickness of the first group well 121w and the thickness of the second group barrier 122b may be equal to the thickness of the first group barrier 121b. Thus, even if the carrier recognizes a predetermined energy barrier in the GaN-based superlattice layer, the carrier may not be extinguished within the GaN-based superlattice layer due to the well and the barrier having the regular thickness, so that the carrier can be effectively injected.

According to the embodiment, the total thickness of the second group GaN-based superlattice layer 122 may be thicker than the total thickness of the first group GaN-based superlattice layer 121. For instance, the second group GaN-based superlattice layer 122 may include the second group well 122w and the second group barrier 122b repeatedly formed with about 8 to 12 periodicities and the first group GaN-based superlattice layer 121 may include the first group well 121w and the first group barrier 121b repeatedly formed with about 3 to 5 periodicities.

According to the embodiment, the hot carriers may be stably cooled for long time in the second group GaN-based superlattice layer 122 that meets partially-cooled hot carriers rather than the first group GaN-based superlattice layer 121 that primarily meets the hot carriers, so the hot carriers may be effectively cooled without being overflown.

In addition, according to the embodiment, the thickness of the third group well 123w of the third group GaN-based superlattice layer 123 may be equal to the thickness of the second group well 122w and thinner than the thickness of the third group barrier 123b.

For instance, the thickness of the third group well 123w may be in the range of about 1 nm to about 3 nm, and the thickness of the third group barrier 123b may be in the range of about 7 nm to about 11 nm, but the embodiment is not limited thereto.

According to the embodiment, the third group barrier 123b may be adjacent to the active layer, and the thickness of the third group barrier 123b, which is the final barrier, may be thicker than that of the barriers and wells of other groups.

According to the embodiment, the third group barrier 123b is doped with a first conductive element to improve the electron injection efficiency. According to the embodiment, the third group barrier 123b may be heavily doped with Si so that the electron injection efficiency can be improved. For instance, the third group barrier 123b may be doped with 19 cc or more of Si, but the embodiment is not limited thereto.

In addition, according to the embodiment, an undoped GaN layer 125 is further provided between the third group barrier 123b and the quantum well 114w of the active layer 114 to prevent the first conductive element doped in the third group barrier 123b from diffusing into the active layer that restricts the radiative recombination.

According to the embodiment, the hot electrons are cooled by the GaN-based superlattice layer having a plurality of energy steps, so that the high-power light emitting device having the effective electron injection layer can be provided.

Then, the active layer 114 is formed on the GaN-based superlattice layer 124.

According to the embodiment, the active layer 114 may include at least one of a single quantum well structure, a multi quantum well (MQW) structure, a quantum dot structure, or a quantum wire structure.

For instance, the active layer 114 can be formed with the MQW structure by injecting TMGa gas, $NH_3$ gas, $N_2$ gas, and trimethyl indium (TMIn) gas, but the embodiment is not limited thereto.

The well layer 114w/barrier layer 114b of the active layer 114 may include at least one of InGaN/GaN, InGaN/InGaN, GaN/AlGaN, InAlGaN/GaN, GaAs(InGaAs)/AlGaAs, and GaP(InGaP)/AlGaP, but the embodiment is not limited thereto. The well layer may be formed of material having a bandgap lower than a bandgap of the barrier layer.

According to the embodiment, an electron blocking layer 126 is formed on the active layer 114 for the purpose of electron blocking and MQW cladding, so that the light emitting efficiency can be improved. For instance, the electron blocking layer 126 may include a semiconductor of $Al_xIn_yGa_{(1-x-y)}N$ ($0 \leq x \leq 1$, $0 \leq y \leq 1$), may have energy bandgap higher than that of the active layer 114 and may have a thickness in the range of about 100 Å to about 600 Å, but the embodiment is not limited thereto.

In addition, the electron blocking layer 126 may have the superlattice structure of $Al_zGa_{(1-z)}N/GaN$ ($0 \leq z \leq 1$), but the embodiment is not limited thereto.

P type ions may be implanted into the electron blocking layer 126 to allow the electron blocking layer 126 to effectively block the overflowing electrons, so that the hole injection efficiency can be improved. For instance, Mg is ion-implanted into the electron blocking layer 126 in the concentration of about $10^{18}/cm^3$ to $10^{20}/cm^3$ to allow the electron blocking layer 126 to effectively block the overflowing electrons, so that the hole injection efficiency can be improved.

After that, the second conductive semiconductor layer 116 is formed on the electron blocking layer 126. The second conductive semiconductor layer 116 may be formed of a semiconductor compound, such as group III-V or group II-VI compound semiconductor, and doped with second conductive dopants.

For instance, the second conductive semiconductor layer 116 may include a semiconductor material having a compositional formula of $In_xAl_yGa_{1-x-y}N$ ($0 \leq x \leq 1$, $0 \leq y \leq 1$, $0 \leq x+y \leq 1$). If the second conductive semiconductor layer 116 is a P type semiconductor, the second conductive dopant is a P type dopant, such as Mg, Zn, Ca, Sr or Ba.

Then, a transparent electrode 130 is formed on the second conductive semiconductor layer 116. The transparent electrode 130 may include a transparent ohmic layer and can be formed by using a single metal or by laminating a meal alloy or metal oxide in a multiple structure.

The transparent electrode 130 may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx and NiO, but the embodiment is not limited thereto.

According to the embodiment, the first conductive semiconductor layer 112 may be prepared as an N type semiconductor layer and the second conductive semiconductor layer 116 may be prepared as a P type semiconductor layer, but the embodiment is not limited thereto. In addition, a semiconductor layer having polarity opposite to that of the second conductive semiconductor layer 116, for instance, an N type semiconductor layer (not shown) may be formed on the second conductive semiconductor layer 116. Thus, the light emitting structure 110 may have one of an N-P junction structure, a P-N junction structure, an N-P-N junction structure and a P-N-P junction structure.

After that, as shown in FIG. 4, the transparent electrode 130, the second conductive semiconductor layer 116, the electron blocking layer 126, the active layer 114 and the GaN-based superlattice layer 124 are partially removed to expose the first conductive semiconductor layer 112.

Then, as shown in FIG. 5, a second electrode 132 is formed on the transparent electrode 130 and a first electrode 131 is formed on the exposed first conductive semiconductor layer 112.

The embodiment can provide a light emitting device having an optimum structure capable of improving the intensity of light at an epitaxial end, a method of manufacturing the same, a light emitting device package, and a lighting system.

For instance, hot electrons are cooled by the GaN-based superlattice layer having a plurality of energy steps, so that a high-power light emitting device having an effective electron injection layer can be provided.

Figure 6:
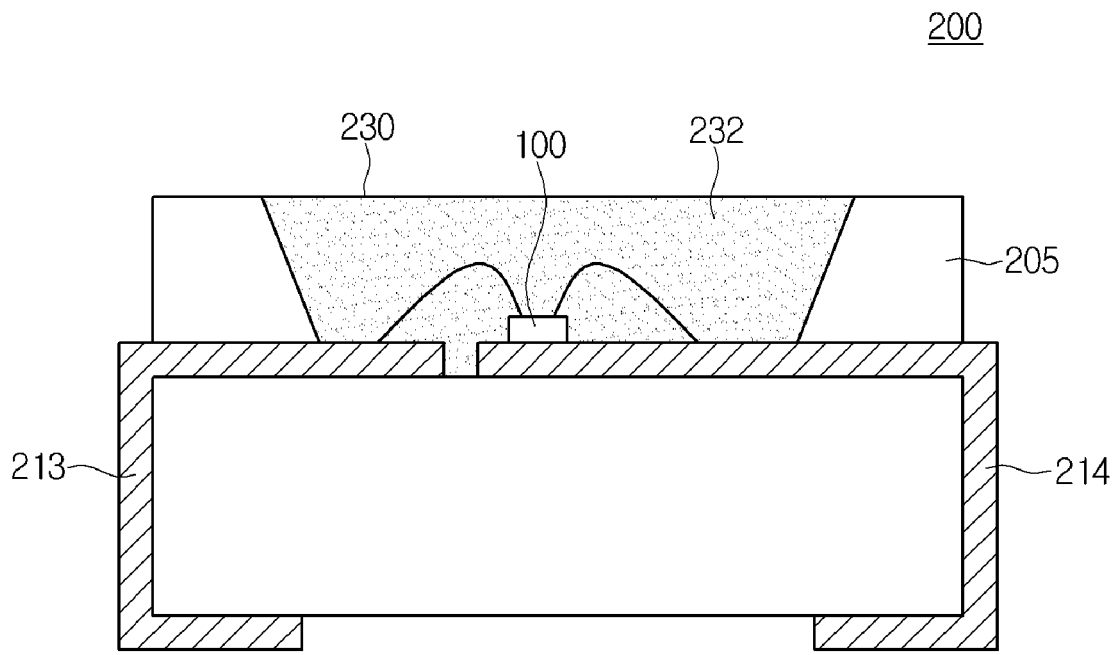
FIG. 6 is sectional view of a light emitting package according to the embodiment.

FIG. 6 is a view showing a light emitting device package 200 in which a light emitting device according to the embodiments is installed.

The light emitting device package 200 according to the embodiment includes a package body 205, third and second lead electrodes 213 and 214 formed on the package body 205, the light emitting device 100 according to the embodiment, which is installed in the package body 205 and electrically connected to the third and second lead electrodes 213 and 214, and a molding member 230 surrounding the light emitting device 100.

The package body 205 may include silicon, synthetic resin, or metallic material. An inclined surface may be formed around the light emitting device 100.

The third and fourth lead electrodes 213 and 214 are electrically insulated from each other and supply power to the light emitting device 100. The third and second lead electrodes 213 and 214 may reflect light emitted from the light emitting device 100 to increase light efficiency, and may dissipate heat generated from the light emitting device 100 to the outside.

The light emitting device 100 may include a lateral type light emitting device shown in FIG. 1, but the embodiment is not limited thereto. In addition, the light emitting device 100 may include a vertical type light emitting device.

The light emitting device 100 may be mounted on the package body 205 or on the third lead electrode 213 or the fourth lead electrode 214.

The light emitting device 100 may be electrically connected with the third lead electrode 213 and/or the fourth lead electrode 214 through one of a wire scheme, a flip chip scheme and a die bonding scheme. Although FIG. 6 shows that the light emitting device 100 is electrically connected with the third lead electrode 213 and the fourth lead electrode 214 through a wire, the embodiment is not limited thereto.

The molding member 230 may protect the light emitting device 100 by surrounding the light emitting device 100. In addition, the molding member 230 may include phosphors (232) to change the wavelength of light emitted from the light emitting device 100.

Figure 7:
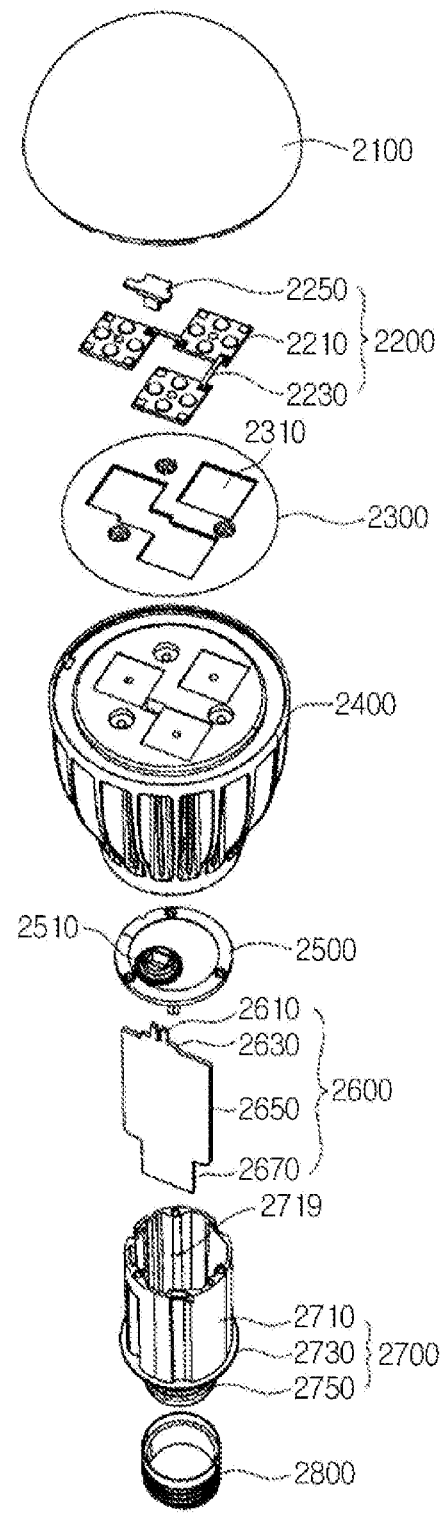
FIGS. 7 to 9 are exploded perspective views showing examples of a lighting system including a light emitting device according to the embodiment.
Figure 8:
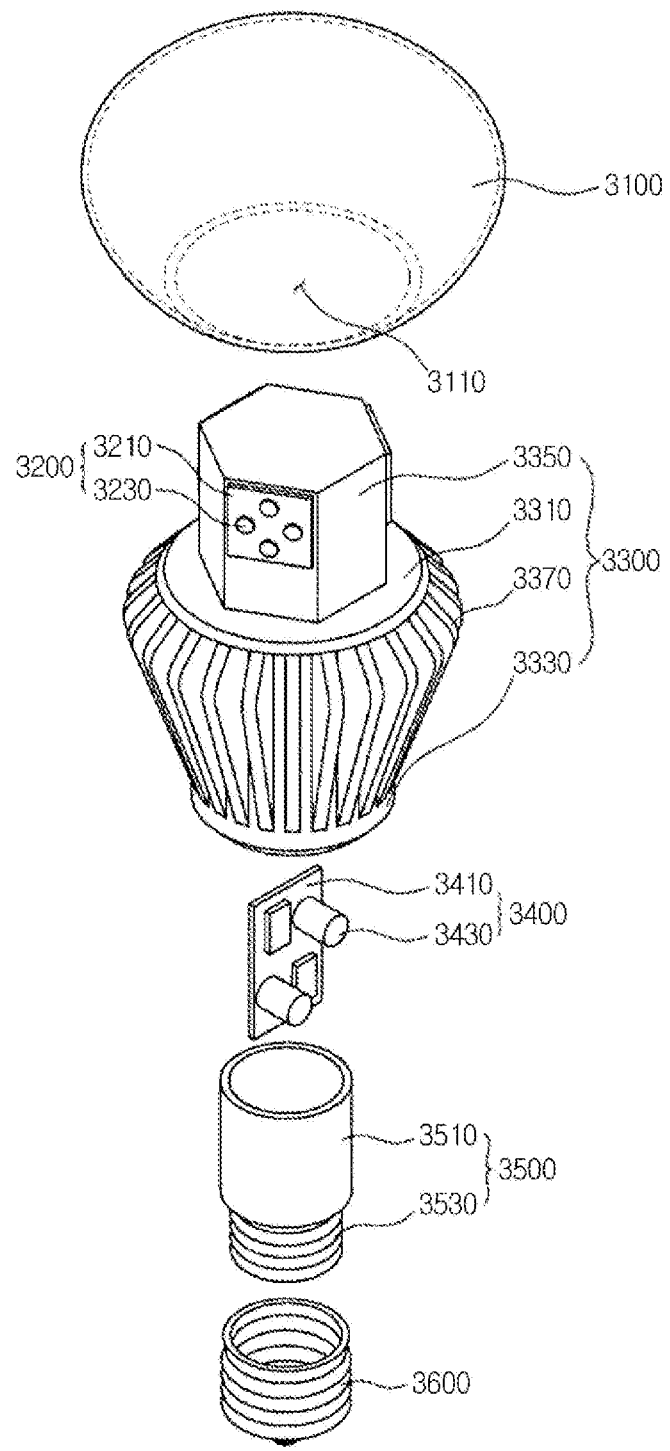
Figure 9:
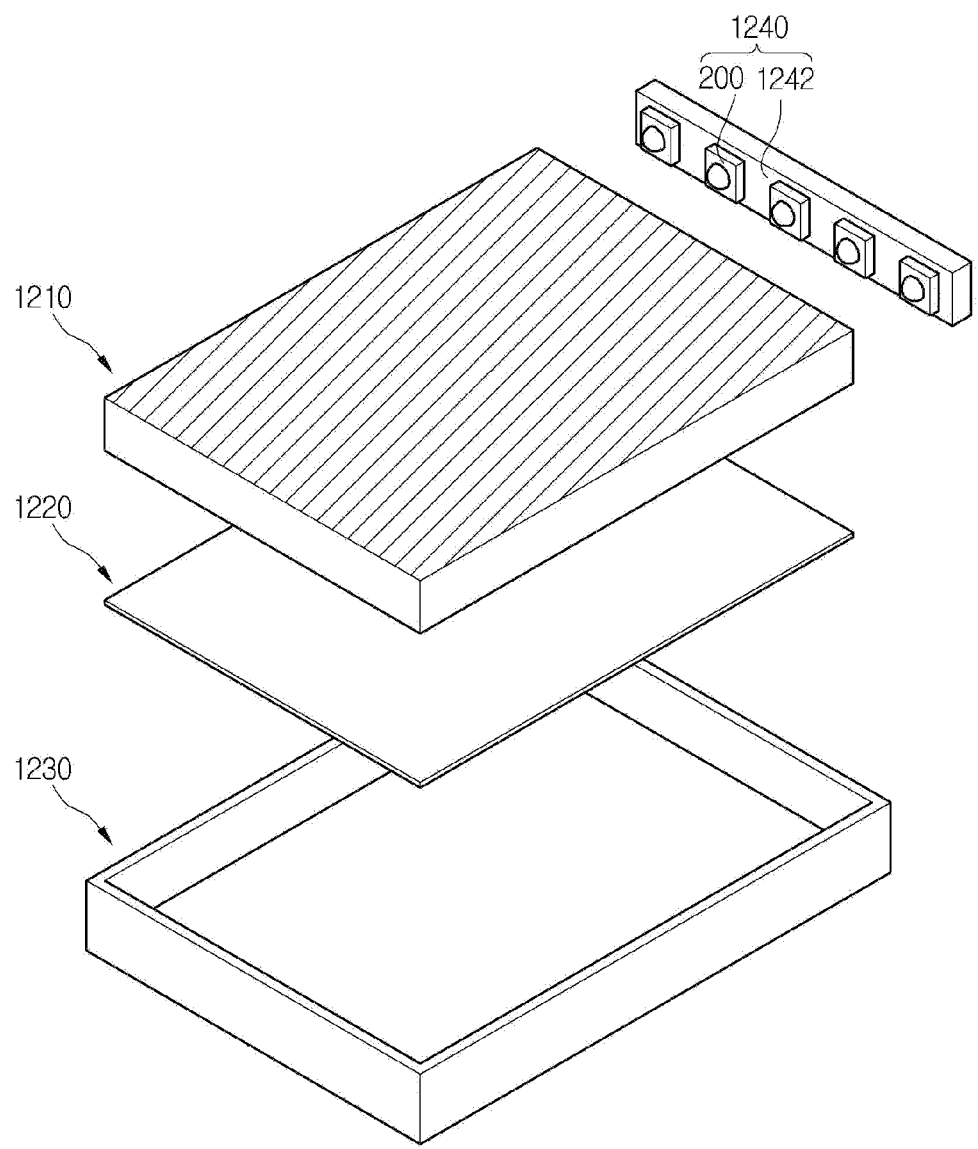

FIGS. 7 to 9 are exploded perspective views showing examples of a lighting system including a light emitting device according to the embodiment.

As shown in FIG. 7, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 3100 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion 2610 of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

As shown in FIG. 8, the lighting system according to the embodiment may include a cover 3100, a light source part 3200, a radiator 3300, a circuit part 3400, an inner case 3500, and a socket 3600. The light source part 3200 may include the light emitting device or the light emitting device module according to the embodiment.

The cover 3100 may have a blub shape and is hollow. The cover 3100 has an opening 3110. The light source part 3200 and a member 3350 may be inserted through the opening 3110.

The cover 3100 may be coupled with the radiator 3300, and may surround the light source part 3200 and the member 3350. The light source part 3200 and the member 3350 may be blocked from the outside by the coupling between the cover 3100 and the radiator 3300. The cover 3100 may be coupled with the radiator 3300 by an adhesive or various schemes such as a rotation coupling scheme and a hook coupling scheme. The rotation coupling scheme is a scheme where a thread of the cover 3100 is coupled with a screw groove of the radiator 3300, and the cover 3100 is coupled with the radiator 3300 by rotation of the cover 3100. The hook coupling scheme is a scheme where a projection of the cover 3100 is inserted into a groove of the radiator 3300 so that the cover 3100 is coupled with the radiator 3300.

The cover 3100 may be optically coupled with the light source part 3200. In detail, the cover 3100 may diffuse, scatter, or excite light provided from a light emitting device 3230 of the light source part 3200. The cover 3100 may be a type of optical member. The cover 3100 may be provided at an inner/outer surface or an inside thereof with a luminescence material in order to excite the light supplied from the light source part 3200.

The cover 3100 may include an inner surface coated with a milk-white paint. The milk-white paint may include a diffusion material to diffuse light. The cover 3100 may have the inner surface of which surface roughness is greater than that of the outer surface thereof. The surface roughness is provided for the purpose of sufficiently scattering and diffusing the light from the light source part 3200.

For example, a material of the cover 3100 may include glass, plastic, polypropylene (PP), polyethylene (PE), and polycarbonate (PC). The polycarbonate (PC) has the superior light resistance, heat resistance and strength among the above materials. The cover 3100 may be transparent so that a user may view the light source module 2200 from the outside, or opaque. The cover 3100 may be formed through a blow molding scheme.

The light source part 3200 is disposed at the member 3350 of the radiator 3300, and a plurality of light source part may be disposed. In detail, the light source part 3200 may be disposed in at least one of a plurality of lateral sides of the member 3350. A top end of the light source part 3200 of the light source part 3200 may be disposed at the lateral side of the member 3350.

The light source part 3200 may be disposed at three of six lateral sides of the member 3350. However, the embodiment is not limited thereto, and the light source part 3200 may be disposed at all lateral sides of the member 3350. The light source part 3200 may include a substrate 3210 and a light emitting device 3230. The light emitting device 32030 may be disposed on one surface of the substrate 3210.

The substrate 3210 has a rectangular shape, but the embodiment is not limited thereto. The substrate 3210 may have various shapes. For example, the substrate 3210 may have a circular shape or a polygonal shape. The substrate 3210 may be provided by printing a circuit pattern on an insulator. For example, the typical printed circuit board (PCB) may include a metal core PCB, a flexible PCB, and a ceramic PCB. In addition, the substrate may have a COB (chips on board) type in which LED chips, which are not packaged, are directly bonded on the PCB. In addition, the substrate 3210 may include a material to effectively reflect light, or the surface of the substrate may have a color such as a gold color or a silver color to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other through the radiator 3300.

The light emitting device 3230 may include a light emitting diode chip to emit red, green, and blue lights or a light emitting diode chip to emit UV. The light emitting diode may have the lateral type or the vertical type. The light emitting diode may emit one of blue, red, yellow, and green lights.

The light emitting device 3230 may include a luminescence material. The luminescence material may include at least one of garnet-based phosphors (YAG, or TAG), silicate-based phosphors, nitride-based phosphors, and oxynitride-based phosphors. The luminescence material may include at least one of a red luminescence material, a yellow luminescence material and a green luminescence material.

The radiator 3300 is coupled with the cover 3100, and may radiate heat from the light source part 3200. The radiator 330 has a predetermined volume, and includes a top surface 3310 and a lateral side 3330. The member 3350 may be disposed on the top surface 3310 of the radiator 3310. The top surface 3310 of the radiator 3300 may be coupled with the cover 3100. The top surface of the radiator 3300 may have a shape corresponding to an opening 3110 of the cover 3100.

A plurality of heat radiation pins 3370 may be disposed at the lateral side 3330 of the radiator 3300. The heat radiation pin 3370 may extend outward from the lateral side of the radiator 3300 or may be connected to the lateral side of the radiator 3300. The heat radiation pin 3370 may improve heat radiation efficiency by increasing a heat radiation area of the radiator 3300. The lateral side 3330 may not include the heat radiation pin 3370.

The member 3350 may be disposed on the top surface of the radiator 3300. The member 3350 may be integrated with or coupled to the top surface 3310 of the radiator 3300. The member 3350 may have the shape of a polygonal prism. In detail, the member 3350 may have the shape of a hexagonal prism. The member 3350 having the shape of a hexagonal prism includes a top surface, a bottom surface, and six lateral sides. The member 3350 may have the shape of a circular prism or the shape of an elliptical prism as well as the shape of a hexagonal prism. When the member 3350 has the shape of a circular prism or the shape of an elliptical prism, the substrate 3210 of the light source part 3200 may be a flexible substrate.

The light source part 3200 may be disposed at six lateral sides of the member 3350. The light source part 3200 may be disposed at all or some of the six lateral sides of the member 3350. The light source part 3200 is disposed at three of the six lateral sides of the member 3350 in FIG. 8.

The substrate 3210 is disposed at the lateral side of the member 3350. The lateral side of the member 3350 may be substantially vertical to the top surface of the radiator 3300. Accordingly, the substrate 3210 and the top surface of the radiator 3300 may be substantially vertical to each other.

The member 3350 may include a material representing thermal conductivity. Thus, heat from the light source part 3200 can be rapidly transferred to the member 3350. For example, the material for the member 3350 may include an alloy of metals such as aluminum (Al), nickel (Ni), copper (Cu), magnesium (Mg), silver (Ag), or tin (Sn). The member 3350 may include a plastic material having thermal conductivity. The plastic material having thermal conductivity is lighter than the metal and has thermal conductivity in a single direction.

The circuit part 3400 receives power from the outside, and converts the received power suitably for the light source part 3200. The circuit part 3400 provides the converted power to the light source part 3200. The circuit part 3400 may be disposed at the radiator 3300. In detail, the circuit part 3400 may be received in the inner case 3500, and may be received in the radiator 3300 together with the inner case 3500. The circuit part 3400 may include a circuit board 3410 and a plurality of components mounted on the circuit board 3410.

The circuit board 3410 has a circular shape, but the embodiment is not limited thereto. That is, the circuit board 3410 may have various shapes. For example, the circuit board may have an elliptical shape or a polygonal shape. The circuit board 3410 may be provided by printing a circuit pattern on an insulator.

The circuit board 3410 is electrically connected to the substrate 3210 of the light source part 3200. For example, the circuit part 3410 and the substrate 3210 may be connected to each other by a wire. The wire may be disposed inside the radiator 3300 to connect the substrate 3210 with the circuit board 3410.

For example, a plurality of components 3430 may include a direct current converter converting AC power provided from an external power supply into DC power, a driving chip controlling driving of the light source part 3200, and an electrostatic discharge (ESD) protective device.

The inner case 3500 receives the circuit part 3400 therein. The inner case 3500 may include a receiving part 3510 to receive the circuit part 3400.

For example, the receiving part 3510 may have a cylindrical shape. The shape of the receiving part 3510 may be changed according to the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled with the socket 3600. The inner case 3500 may include a connecting part 3530 coupled with the socket 3600. The connecting part 3530 may have a thread structure corresponding to a screw groove structure of the socket 3600. The inner case 3500 is an insulator. Accordingly, the inner case 3500 prevents electric short between the circuit part 3400 and the radiator 3300. For example, the inner case 3500 may include a plastic or resin material.

The socket 3600 may be coupled with the inner case 3500. In detail, the socket 3600 may be coupled with the connecting part 3530 of the inner case 3500. The socket 3600 may have the same structure as that of a conventional incandescent light bulb. The socket 3600 is electrically connected to the circuit part 3400. For example, the circuit part 3400 and the socket 3600 may be connected to each other by a wire. If external power is applied to the socket 3600, the external power may be transferred to the circuit part 3400. The socket 360 may have a screw groove structure corresponding to a thread structure of the connecting part 3550.

Further, as shown in FIG. 9, the lighting system according to the embodiment, for example, a backlight unit includes a light guide plate 1210, a light emitting module 1240 for providing the light to the light guide plate 1210, a reflective member 1220 positioned below the light guide plate 1210, and a bottom cover 1230 for receiving the light guide plate 1210, the light emitting module 1240, and the reflective member 1220 therein, but the embodiment is not limited thereto.

The light guide plate 1210 diffuses the light to provide surface light. The light guide plate 1210 includes transparent material. For instance, the light guide plate 1210 can be manufactured by using acryl-based resin, such as PMMA (polymethyl methacrylate), PET (polyethylene terephthalate), PC (polycarbonate), COO or PEN (polyethylene naphthalate) resin.

The light emitting module 1240 supplies the light to at least one lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB) as well as a typical PCB, but the embodiment is not limited thereto.

In addition, the light emitting device packages 200 are arranged on the substrate 1242 such that light exit surfaces of the light emitting device packages 200 are spaced apart from the light guide plate 1210 by a predetermined distance.

The reflective member 1220 is disposed below the light guide plate 1210. The reflective member 1220 reflects the light, which is traveled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

A plurality of light emitting device packages according to the embodiment may be arrayed on the substrate and the light guide plate, the prism sheet, the diffusion sheet and the fluorescent sheet serving as optical members may be disposed on a path of light emitted from the light emitting device packages. The light emitting packages, the substrate, and the optical member may serve as the backlight unit or a lighting unit. For example, the lighting system may include the backlight unit, the lighting unit, an indicator, a lamp, or a street lamp.

The invention claimed is:

1. A light emitting device comprising:
a first conductive semiconductor layer;
a GaN-based superlattice layer on the first conductive semiconductor layer;
an active layer on the GaN-based superlattice layer; and
a second conductive semiconductor layer on the active layer,
wherein the GaN-based superlattice layer has a bandgap energy level that varies in a direction from the first conductive semiconductor layer to the active layer,
wherein the GaN-based superlattice layer comprises a first group GaN-based superlattice layer, a second group GaN-based superlattice layer, and a third group GaN-based superlattice layer, and wherein the third group GaN-based superlattice layer comprises a third group well and a third group barrier, and a thickness of the third group well is thinner than a thickness of the third group barrier.

2. The light emitting device of claim 1, wherein the first group GaN-based superlattice layer have a first bandgap energy; and
the second group GaN-based superlattice layer is formed on the first group GaN-based superlattice layer and have a second bandgap energy lower than the first bandgap energy.

3. The light emitting device of claim 2, wherein a difference of a level between the first bandgap energy and the second bandgap energy is equal to or higher than a phonon energy level of the GaN-based superlattice layer.

4. The light emitting device of claim 3, wherein a difference of a well depth between the first group GaN-based superlattice layer and the second group GaN-based superlattice layer is equal to or higher than a phonon energy of InGaN.

5. The light emitting device of claim 4, wherein the GaN-based superlattice layer comprises a plurality of energy steps and a number of the energy steps is determined by dividing a depth of a quantum well of the active layer by a minimum phonon energy.

6. The light emitting device of claim 1, wherein the GaN-based superlattice layer comprises an $In_xGa_{1-x}N/GaN$ superlattice layer ($0<x<1$).

7. The light emitting device of claim 6, wherein a concentration of indium in the second group GaN-based superlattice layer is higher than a concentration of indium in the first group GaN-based superlattice layer.

8. The light emitting device of claim 1, wherein a thickness of the first group GaN-based superlattice layer is thinner than a thickness of the second group GaN-based superlattice layer.

9. The light emitting device of claim 1, wherein the first group GaN-based superlattice layer comprises a first group well and a first group barrier, and a thickness of the first group well is equal to a thickness of the first group barrier.

10. The light emitting device of claim 1, wherein the second group GaN-based superlattice layer comprises a second group well and a second group barrier, and a thickness of the second group well is equal to a thickness of the second group barrier.

11. The light emitting device of claim 9, wherein the second group GaN-based superlattice layer comprises a second group well and a second group barrier, a thickness of the second group well is equal to the thickness of the first group well and a thickness of the second group barrier is equal to the thickness of the first group barrier.

12. The light emitting device of claim 2, wherein the third group GaN-based superlattice layer is formed on the second group GaN-based superlattice layer and have a third bandgap energy.

13. The light emitting device of claim 1, wherein the third group barrier is doped with a first conductive element.

14. The light emitting device of claim 13, wherein the first conductive element doped in the third group barrier comprises Si.

15. The light emitting device of claim 1, further comprising an undoped GaN layer between the third group barrier and a quantum well of the active layer.

16. The light emitting device of claim 15, wherein the undoped GaN layer is thinner than the third group barrier.

17. The light emitting device of claim 12, wherein the third group GaN-based superlattice layer comprises a third group well and a third group barrier, the second group GaN-based superlattice layer comprises a second group well and a second group barrier, the third group well has a thickness equal to a thickness of the second group well, and a thickness of the third group barrier is thicker than a thickness of the second group barrier.

18. The light emitting device of claim 17, wherein the third group barrier is doped with a first conductive element.

19. The light emitting device of claim 17, further comprising an undoped GaN layer between the third group barrier and a quantum well of the active layer.

* * * * *